United States Patent
Ohkawa et al.

(10) Patent No.: US 7,999,717 B2
(45) Date of Patent: Aug. 16, 2011

(54) FOLDING CIRCUIT AND ANALOG-TO-DIGITAL CONVERTER

(75) Inventors: Takeshi Ohkawa, Kanagawa (JP); Koichi Ono, Kanagawa (JP); Kouji Matsuura, Chiba (JP); Yukitosi Yamashita, Nagasaki (JP); Junji Toyomura, Nagasaki (JP); Shogo Nakamura, Nagasaki (JP); Norifumi Kanagawa, Nagasaki (JP)

(73) Assignee: Sony Corporation, Tokyo (JP)

( * ) Notice: Subject to any disclaimer, the term of this patent is extended or adjusted under 35 U.S.C. 154(b) by 198 days.

(21) Appl. No.: 12/439,757

(22) PCT Filed: Sep. 4, 2007

(86) PCT No.: PCT/JP2007/067161
§ 371 (c)(1),
(2), (4) Date: Mar. 3, 2009

(87) PCT Pub. No.: WO2008/029778
PCT Pub. Date: Mar. 13, 2008

(65) Prior Publication Data
US 2011/0001648 A1    Jan. 6, 2011

(30) Foreign Application Priority Data
Sep. 4, 2006 (JP) ................................. 2006-239097

(51) Int. Cl.
*H03M 1/36* (2006.01)
(52) U.S. Cl. .......................... 341/159; 341/155; 341/158
(58) Field of Classification Search .................. 341/155, 341/156, 159
See application file for complete search history.

(56) References Cited

U.S. PATENT DOCUMENTS

| | | | |
|---|---|---|---|
| 5,307,067 A * | 4/1994 | Kimura et al. | 341/159 |
| 5,945,935 A * | 8/1999 | Kusumoto et al. | 341/159 |
| 6,034,630 A * | 3/2000 | Komatsu et al. | 341/159 |
| 6,166,674 A * | 12/2000 | Wingender et al. | 341/158 |

(Continued)

FOREIGN PATENT DOCUMENTS

JP    2000 165241    6/2000

OTHER PUBLICATIONS

Geelen, G.; Paulus, E.; "An 8b 600MS/s 200Mw CMOS folding A/D converter using an amplifier preset technique", Solid-State Circuits Conference, 2004. Digest of Technical papers. ISSCC. 2004 IEEE International, vol. 1, 2004, pp. 254-526.

*Primary Examiner* — Linh V Nguyen
(74) *Attorney, Agent, or Firm* — Frommer Lawrence & Haug LLP; William S. Frommer; Ellen Marcie Emas

(57) ABSTRACT

A folding circuit and an analog-to-digital converter wherein a response to small signals is improved, a load on a clock signal can be reduced, and the increase of circuit area can be prevented. The circuit includes a reference voltage generating circuit that generates a plurality of differential voltages as reference voltages, and a plurality of amplification circuits that convert differential voltages between the plurality of reference voltages and an analog input voltage to differential currents, and output these differential currents. The output ends of the amplification circuits are alternately connected. Each of the amplification circuit is configured by a differential amplifier circuit having cascode output transistors (145, 146). A switch (144), which is turned on in synchronization with the control clock, is provided between the both sources of the cascode output transistors (145,146).

4 Claims, 16 Drawing Sheets

U.S. PATENT DOCUMENTS

| | | | |
|---|---|---|---|
| 6,411,246 B2 * | 6/2002 | Nagaraj | 341/158 |
| 6,480,133 B2 * | 11/2002 | Kobayashi et al. | 341/156 |
| 6,577,185 B1 * | 6/2003 | Chandler et al. | 330/9 |
| 6,707,413 B2 * | 3/2004 | Sushihara et al. | 341/159 |
| 7,061,419 B2 * | 6/2006 | Sushihara et al. | 341/155 |
| 7,277,041 B2 * | 10/2007 | Scholtens | 341/159 |
| 7,420,497 B2 * | 9/2008 | Chiu | 341/155 |
| 7,649,486 B2 * | 1/2010 | Toyomura et al. | 341/159 |
| 2002/0093447 A1 * | 7/2002 | Li | 341/158 |
| 2004/0080445 A1 * | 4/2004 | Choi | 341/159 |
| 2007/0188366 A1 * | 8/2007 | Makigawa et al. | 341/155 |

* cited by examiner

US 7,999,717 B2

FOLDING CIRCUIT AND ANALOG-TO-DIGITAL CONVERTER

TECHNICAL FIELD

The present invention relates to a folding circuit and to an analog-to-digital converter including this circuit.

BACKGROUND ART

FIG. 1 is a circuit diagram showing a general folding circuit.

This folding circuit 10 has a ladder resistor 11 generating a reference voltage, a plurality of amplification circuits D1 to D5 having alternately connected current output ends, and load resistors R1 and R2.

The ladder resistor 11 has a plurality of resistors R3 to R6 tandem connected between a supply terminal of a maximum reference voltage Vrt and a supply terminal of a minimum reference voltage Vrb. From the respective nodes between the resistors and the above two supply terminals, a plurality of reference voltages Vrb, Vr1, Vr2, Vr3, and Vrt having sequentially changing values are output.

Each of the plurality of amplification circuits D1 to D5 compares an input voltage Vin with the reference voltage Vr (maximum reference voltage Vrt, minimum reference voltage Vrb, or reference voltage Vri (i=1, 2, 3)) and outputs a current (pulls a current from the output end) in accordance with a difference between the input voltage Vin and the reference voltage Vr.

FIG. 2 is a diagram showing an example of the circuit of the amplification circuits.

Each of the amplification circuits D1 to D5 is configured by, as illustrated, two NMOS transistors 12a and 12b forming a differential pair, and one current source 13. A voltage of an input signal (input voltage Vin) is applied to a gate of the NMOS transistor 12a, and the reference voltage Vr is input to a gate of the other NMOS transistor 12b. Sources of the NMOS transistors 12a and 12b are connected to each other and biased by a current flowing in the current source 13.

When a differential pair (amplification circuit) is biased by the current source 13 in this way, an input/output characteristic thereof becomes as shown in FIG. 3.

In the configuration of FIG. 1, when considering this input/output characteristic (FIG. 3), each time an amplification circuit exceeds the reference voltage Vr, the transistor pulling in the current in the differential pair is switched from the NMOS transistor 12b side to which the reference voltage Vr is applied (hereinafter referred to as a "positive phase output side") to the NMOS transistor 12a side to which the input voltage Vin is applied (hereinafter referred to as an "inverse phase output side") as shown in FIG. 2. By this switching of the output current (steering), folded waves having sequentially different values of reference voltages Vr as threshold values are generated.

Next, an explanation will be given of the generation of folded waves by an example of use of five amplification circuits (FIG. 1). In the amplification circuits D1 to D5, a notation "−" represents that a terminal side corresponding to the input terminal is the inverse phase output side, and another notation "+" represents that a terminal corresponding to the input terminal is the positive phase output side.

First, in the case where the relationship between the input voltage Vin and the minimum reference voltage Vrb is the input voltage Vin<Vrb, the outputs of all amplification circuits D1 to D5 output the output currents Io from the positive phase output side. For this reason, when the current flowing in the load resistor R1 (load current) is defined as Ir1 and the current flowing in the load resistor R2 (load current) is defined as Ir2, the following equations (1-1) and (1-2) stand:

[Equations 1]

$$Ir1 = 3Io \quad (1\text{-}1)$$

$$Ir2 = 2Io \quad (1\text{-}2)$$

Next, when the input voltage Vin exceeds the minimum reference voltage Vrb and is less than the next reference voltage Vr1 (Vrb<input voltage Vin<Vr1), by the input voltage Vin exceeding the minimum reference voltage Vrb supplied to the amplification circuit D1, the amplification circuit D1 steers the output current Io thereof from the positive phase output side to the inverse phase output side, and at this time, the load currents Ir1 and Ir2 flowing in the load resistors R1 and R2 are changed as in the following equations (2-1) and (2-2):

[Equations 2]

$$Ir1 = 2Io \quad (2\text{-}1)$$

$$Ir2 = 3Io \quad (2\text{-}2)$$

Next, when the input voltage Vin exceeds the reference voltage Vr1 and is less than the next reference voltage Vr2 (Vr1<input voltage Vin<Vr2), by the input voltage Vin exceeding the reference voltage Vr1 connected to the amplification circuit D2, the amplification circuit D2 steers the output current Io thereof from the positive phase output side to the inverse phase output side, at this time, the load currents Ir1 and Ir2 flowing in the load resistors R1 and R2 are changed as in the following equations (3-1) and (3-2):

[Equations 3]

$$Ir1 = 3Io \quad (3\text{-}1)$$

$$Ir2 = 2Io \quad (3\text{-}2)$$

Hereinafter, whenever the input voltage Vin sequentially exceeds the reference voltages Vr2 and Vr3, the amplification circuits D3, D4, and D5 steer the output currents Io thereof from the positive phase output side to the inverse phase output side. Thus, folded waves shown in FIG. 4 are generated.

In the folding circuit, as explained before, the change of the input signal increases by exactly the number of folding, therefore, the input band tends to become low. For this reason, a track/hold circuit (T/H) stopping the change of input signal in synchronization with a control clock is often provided at the input stage. Due to this, an input band can be easily extended up to a band of the T/H.

On the other hand, the amplification circuits generating the folded waves are circuits of continuous systems, therefore, it is generally known that these circuits are very weak against a response to a large amplitude. A major reason of this is that the bias current is completely steered by applying excessive input to the differential pair configuring the folding circuit, and one side transistor cuts off.

With respect to such a problem, the technique as in Non-Patent Document 1 solves the problem and achieves high speed response.

This approach is, as shown in FIG. 5, intended that improvement of a recovery time of an amplification circuit by providing a switch 14 at an output end of the amplification circuit generating a folded wave, turning on the switch for only a track period of a track/hold circuit (T/H), and resetting the output end. The fact that the speed becomes five times faster than the conventional technology by this is described in Non-Patent Document 1.

Non-Patent Document 1: "An 8b 600 MS/s 200 mW CMOS Folding A/D Converter Using an Amplifier Preset Technique", Govert Geelen et al., ISSCC04 Digest of Technical Paper, 14.2, 2004 Feb.

DISCLOSURE OF INVENTION

Technical Problem

As explained above, the approach of preventing output saturation at the time where the signal having an excessive amplitude by performing a short-circuiting and resetting the output end of the amplification circuit by using the switch 14, has the effect of speeding up the response of the amplification circuit, and thus is very good.

However, since the switch is provided at the output end, a parasite capacitance of the switch is added to the output end as well, therefore, a response to a small signal tends to be sacrificed.

Further, with respect to a folding AD converter, in a parallel type, a track/hold receives a differential analog input signal outputs a differential output following a differential analog input signal at the time of tracking, holds the input signals at the time of a rising (trailing) edge of a CLK signal at the time of holding, and outputs a differential output a differential amplifier circuit amplifies the same and outputs the differential output, and a differential distributed amplifier circuit generates a desired folded wave.

Further, the following approaches have been tried out for realizing a high speed AD converter.

(1) Providing a switch at the differential outputs of distributed amplifier circuits so as to keep down the amplitude at the time of tracking and speeding the response of amplification circuits at the time of holding.

(2) Employing a cascade type reducing the numbers of the first stage differential amplifier circuits and differential distributed amplifier circuits, reducing the parasite capacitance at nodes generating the folded wave, and thereby speeding the response of the amplification circuits.

However, these techniques suffer from the following disadvantages.

(1') Providing the switch at the differential outputs of the distributed amplifier circuits results in the addition of the parasite capacitance of the switch and degrades the small signal response by that amount.

(2') Employing the cascade type and providing a reset switch at the differential distributed amplifier circuits of each stage increases a load on the CLK signal and further increases the circuit area.

The present invention provides a folding circuit and an analog-to-digital converter having a good small signal response, able to reduce the load on the clock signal, and able to prevent the increase of a circuit area configuring a circuit.

Technical Solution

A first aspect of the present invention is a folding circuit having: a reference voltage generating circuit that generates a plurality of different voltages as reference voltages; and a plurality of amplification circuits that convert differential voltages between the plurality of reference voltages and an analog input voltage to differential currents for output, and wherein output ends of the amplification circuits are alternately connected, each of the amplification circuits is configured by a differential amplifier circuit having cascode output transistors, and a switch is provided which is turned on in synchronization with the control clock between sources of cascode output transistors.

Preferably, a pre-amplification circuit which is configured by a differential pair input stage, cascode output transistors, and a load resistor is provided at a front stage of each amplification circuit, and a switch which is turned on in synchronization with the control clock is provided between sources of the cascode output transistors of the pre-amplification circuit.

A second aspect of the present invention is an analog-to-digital converter having a folding circuit generating folded waves of a predetermined number of folds, wherein the folding circuit has a reference voltage generating circuit that generates a plurality of different voltages as reference voltages, and a plurality of amplification circuits that convert differential voltages between the plurality of reference voltages and an analog input voltage to differential currents for output, and wherein output ends of the amplification circuits are alternately connected, each of the amplification circuits is configured by a differential amplifier circuit having cascode output transistors, and a switch, which is turned on in synchronization with the control clock, being provided between sources of the cascode output transistors.

According to the present invention, a reset switch is provided at the node on the source side of the cascode transistors.

Due to this, an output differential amplitude can be suppressed without adding a parasite capacitance of the switch to the differential current outputs of the amplification circuit.

ADVANTAGEOUS EFFECTS

According to the present invention, a response to small signals is good, the load on clock signals can be reduced, and the increase of circuit area configuring the circuit can be prevented.

EXPLANATION OF REFERENCES

100 . . . parallel type folding AD converter, 100A . . . cascade type folding AD converter, 110 . . . track/hold (T/H) circuit, 120, 120A . . . reference voltage generating circuits, 130, 130A . . . pre-amplification circuit groups, 140 . . . distributed amplifier circuit group, 140A . . . first distributed amplifier circuit group, 150 . . . load resistor group, 150A . . . second load resistor group, 160 . . . buffer group, 160A . . . second buffer group, 170 . . . interpolation circuit, 170A . . . second interpolation circuit, 180 . . . higher side master comparator latch group, 190 . . . lower side master comparator latch group, 200 . . . first load resistor group, 210 . . . first buffer group, 220 . . . first interpolation circuit, 230 . . . second distributed amplifier circuit group, 144 . . . reset switch, 145, 146 . . . cascode transistors (NMOS transistors), NT1304, NT1310 . . . reset switches, and NT1305, NT1306, NT1311, NT1312 . . . cascode transistors.

BEST MODE FOR CARRYING OUT THE INVENTION

Below, embodiments of the present invention will be explained with reference to the drawings.

First Embodiment

Figure 1:
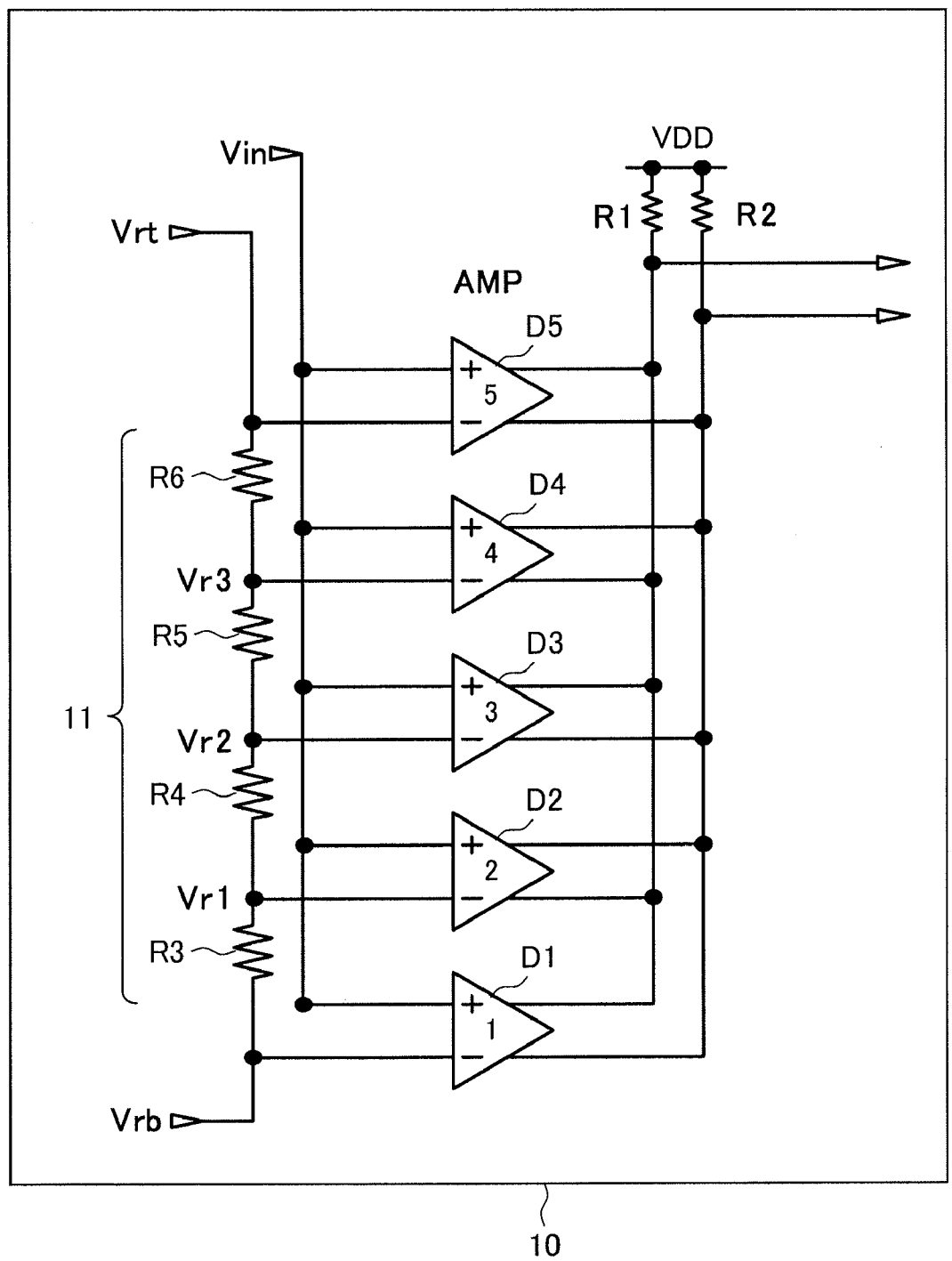
FIG. 1 A circuit diagram of a general folding circuit.
Figure 2:
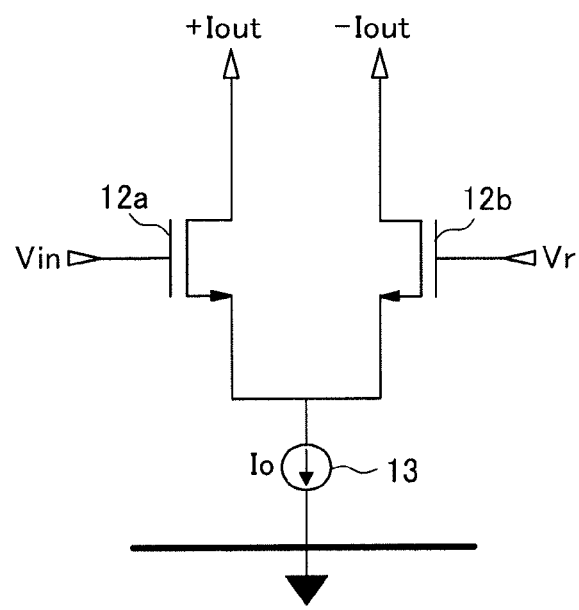
FIG. 2 A circuit diagram of an amplification circuit.
Figure 3:
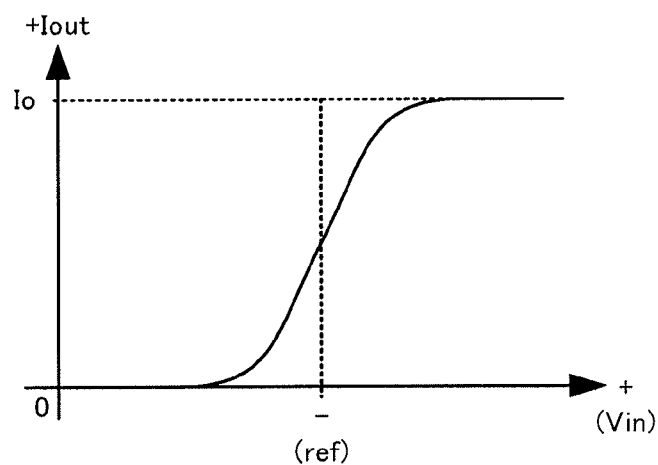
FIG. 3 An input/output characteristic diagram of the amplification circuit.
Figure 4:
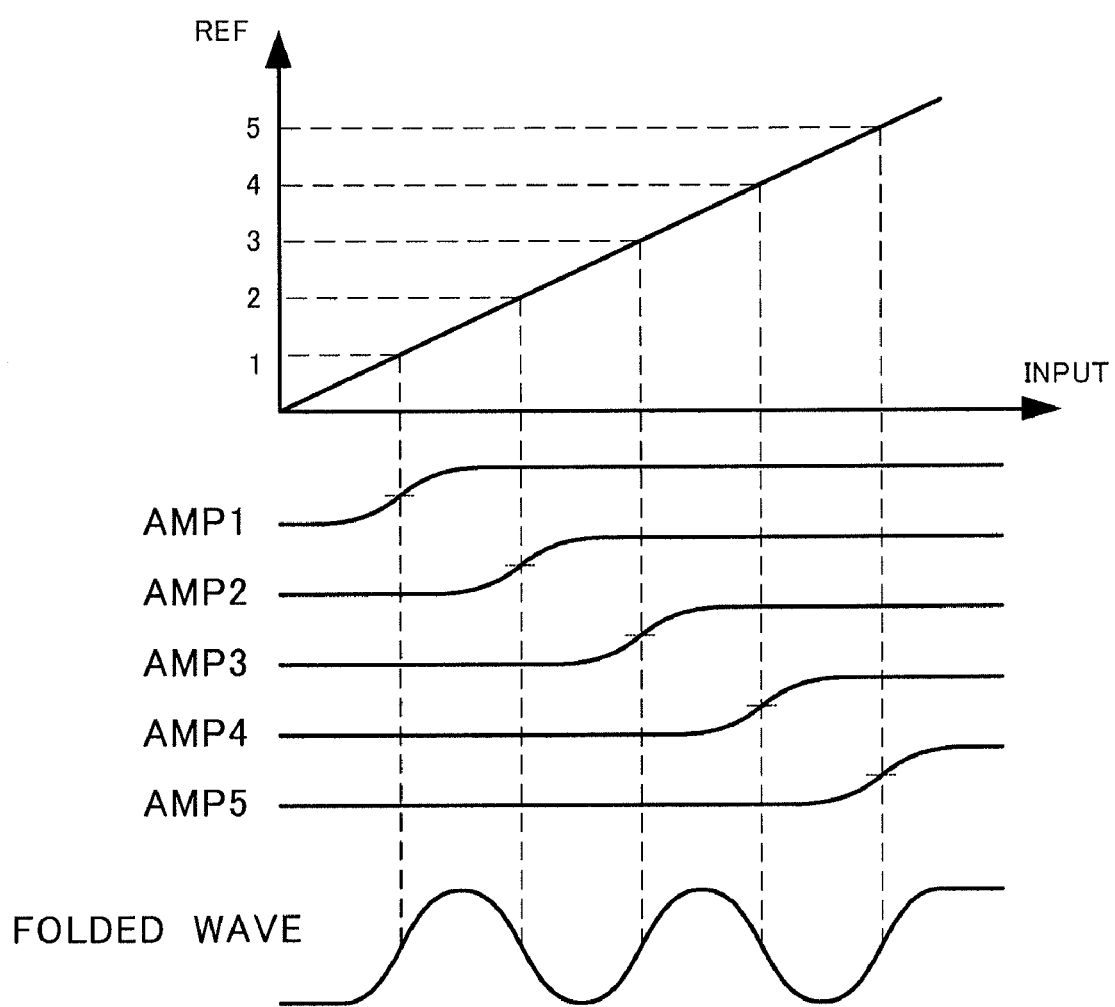
FIG. 4 A folded wave diagram.
Figure 5:
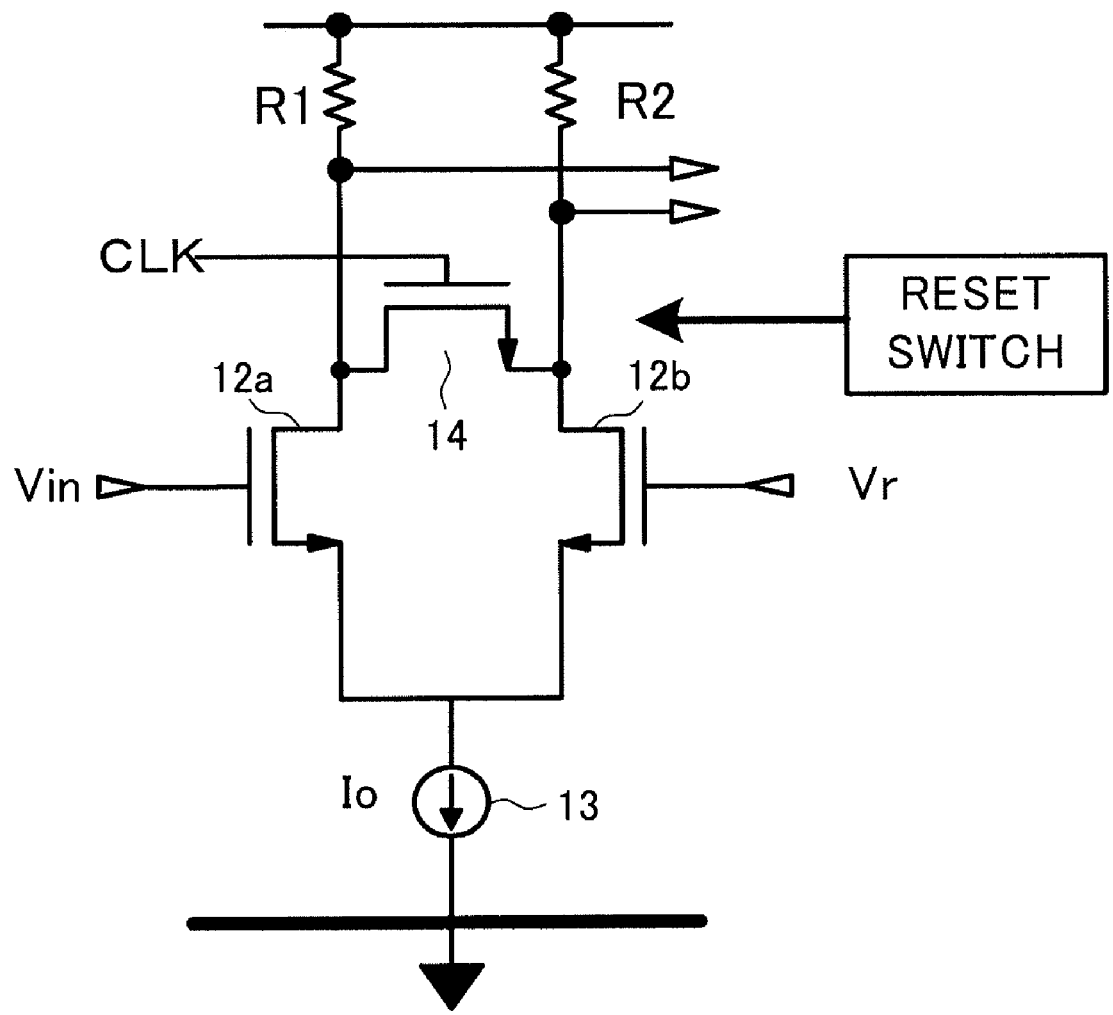
FIG. 5 A circuit diagram showing a differential amplifier circuit equipped with a reset switch.
Figure 6:
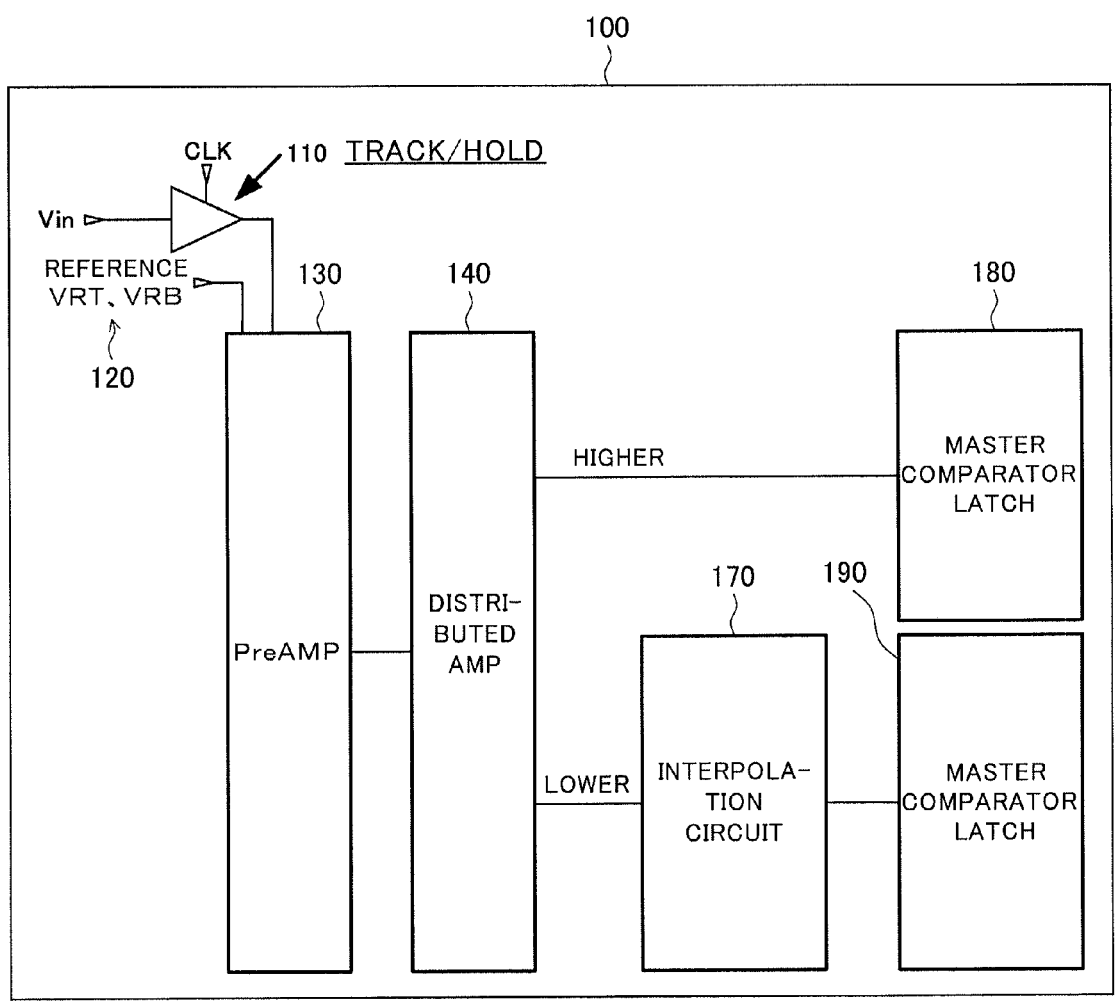
FIG. 6 A block diagram showing an example of the configuration of a parallel type folding AD converter according to a first embodiment of the present invention.

FIG. 6 is a block diagram showing an example of the configuration of a parallel type folding AD converter according to a first embodiment of the present invention.

Figure 7:
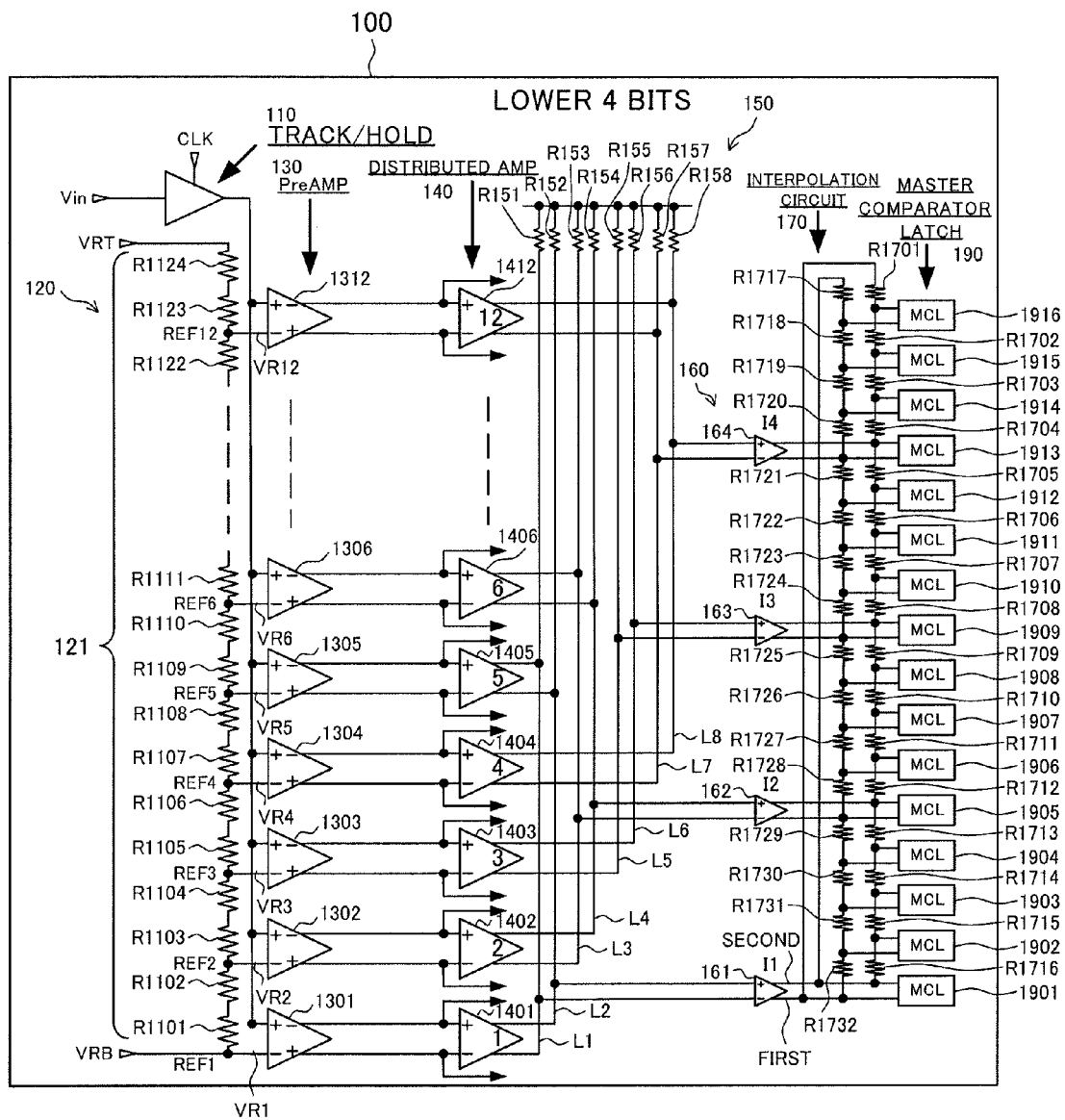
FIG. 7 A circuit diagram showing an example of the configuration of lower bits of the parallel type folding AD converter of FIG. 6.

Also, FIG. 7 is a circuit diagram showing a concrete example of the configuration of lower bits of the parallel type folding AD converter of FIG. 6.

The present folding AD converter 100, as shown in FIG. 6 and FIG. 7, has a track/hold (T/H) circuit 110, reference voltage generating circuit 120, pre-amplification circuit group 130, distributed amplifier circuit group 140, load resistor group 150, buffer group 160, lower side interpolation circuit 170, higher side master comparator latch group 180, and lower side master comparator latch group 190.

Note that, in FIG. 6, for example, the load resistor group 150 is included in the distributed amplifier circuit group 140, and the buffer group 160 is included in the interpolation circuit 170.

The track/hold circuit 110 has the function of stopping the change of the input signal Vin in synchronization with a control clock signal CLK in the input stage.

The track/hold circuit 110 tracks the signal when the clock signal CLK is at high level, and holds the signal at the time of a low level for the output.

The outputs of the track/hold circuit 110 are supplied in parallel to non-inverted inputs (+) of the differential amplifier circuits of the pre-amplification circuit group 130.

The reference voltage generating circuit 120 has a ladder resistor 121.

The ladder resistor 121 has a plurality of resistors R1101 to R1124 tandem connected between a supply terminal of the maximum reference voltage VRT and a supply terminal of the minimum reference voltage VRB. From nodes REF1 to REF12 between two series connected resistors and the above two supply terminals, a plurality of reference voltages VRB, VR1, VR2, VR3, . . . , VR12 whose values sequentially change are output.

The pre-amplification circuit group 130 has a plurality of, for example, 12 differential amplifier circuits 1301 to 1312.

The plurality of differential amplifier circuits 1301 to 1312 compare the input voltage Vin with the reference voltages VR1 to VR12 and output currents to the distributed amplifier circuit group 140 (pull-in currents from the output ends) in accordance with differences between the input voltage Vin and the reference voltages VR1 to VR12.

The distributed amplifier circuit group 140 has a plurality of, for example, 12 differential distributed amplifier circuits 1401 to 1412.

Figure 8:
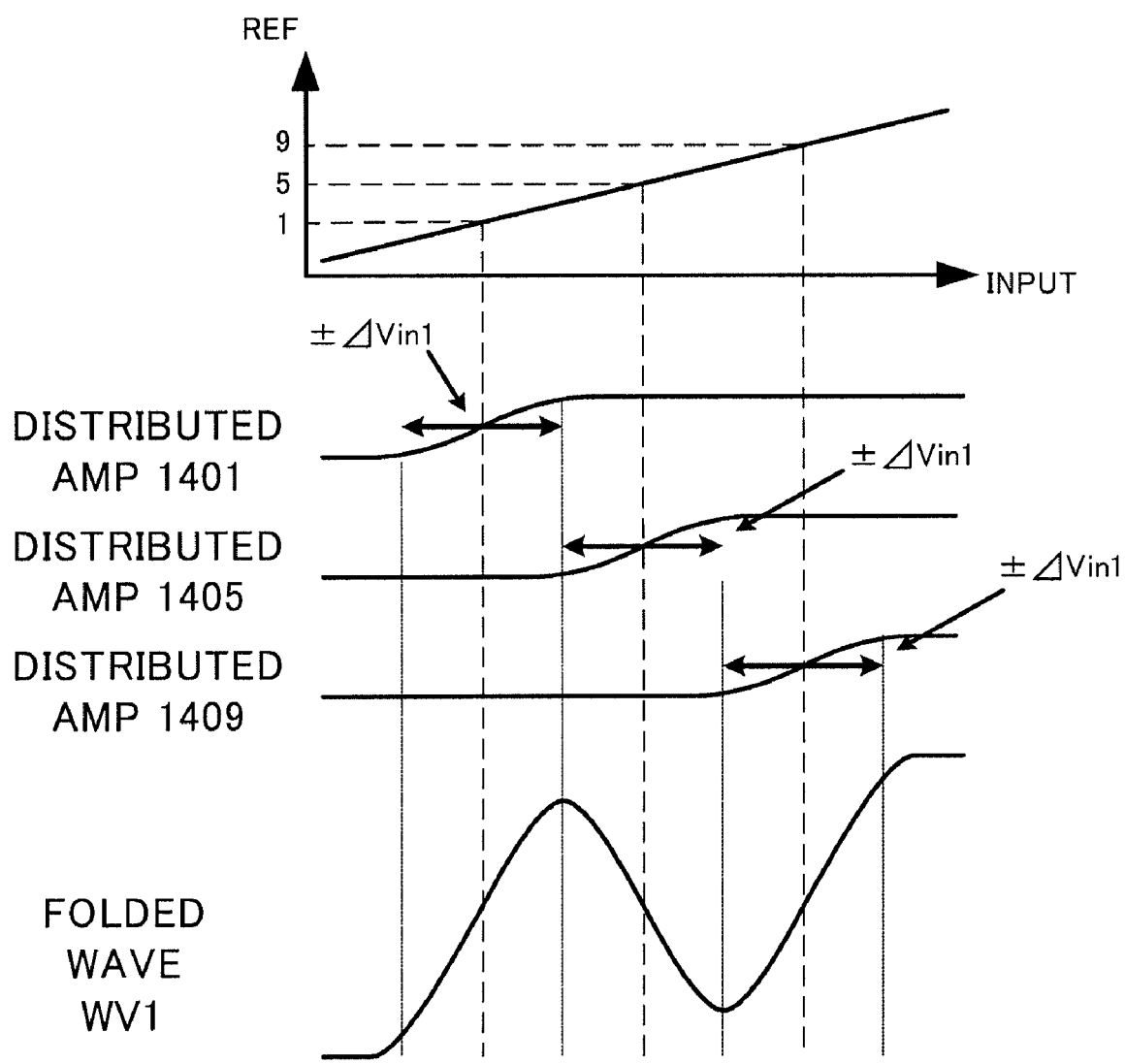
FIG. 8 A diagram showing a folded wave of the distributed amplifier circuit output in the first embodiment.

The differential distributed amplifier circuits 1401 to 1412 receive negative side outputs of the corresponding differential amplifier circuits 1301 to 1312 of the pre-amplification circuit group 130 at non-inverted input terminals (+), receive positive side outputs at inverted input terminals (−), and generate so-called "folded waves" as shown in FIG. 8.

Here, ΔVin1 in FIG. 8 is an input dynamic range of the differential distributed amplifier circuit.

By superimposing these linear ranges on each other in the 1st, 5th, and 9th differential distributed amplifier circuits 1401, 1405, and 1409, a first folded wave WV1 having a degree 3 is generated.

In the same way, by superimposing them in the 2nd, 6th, and 10th differential distributed amplifier circuits 1402, 1406, and 1410, a second folded wave WV2 having a degree 3 is generated.

By superimposing them in the 3rd, 7th, and 11th differential distributed amplifier circuits 1403, 1407, and 1411, a third folded wave WV3 having a degree 3 is generated.

By superimposing them in the 4th, 8th, and 12th differential distributed amplifier circuits 1404, 1408, and 1411, a fourth folded wave WV4 having a degree 3 is generated.

Figure 9:
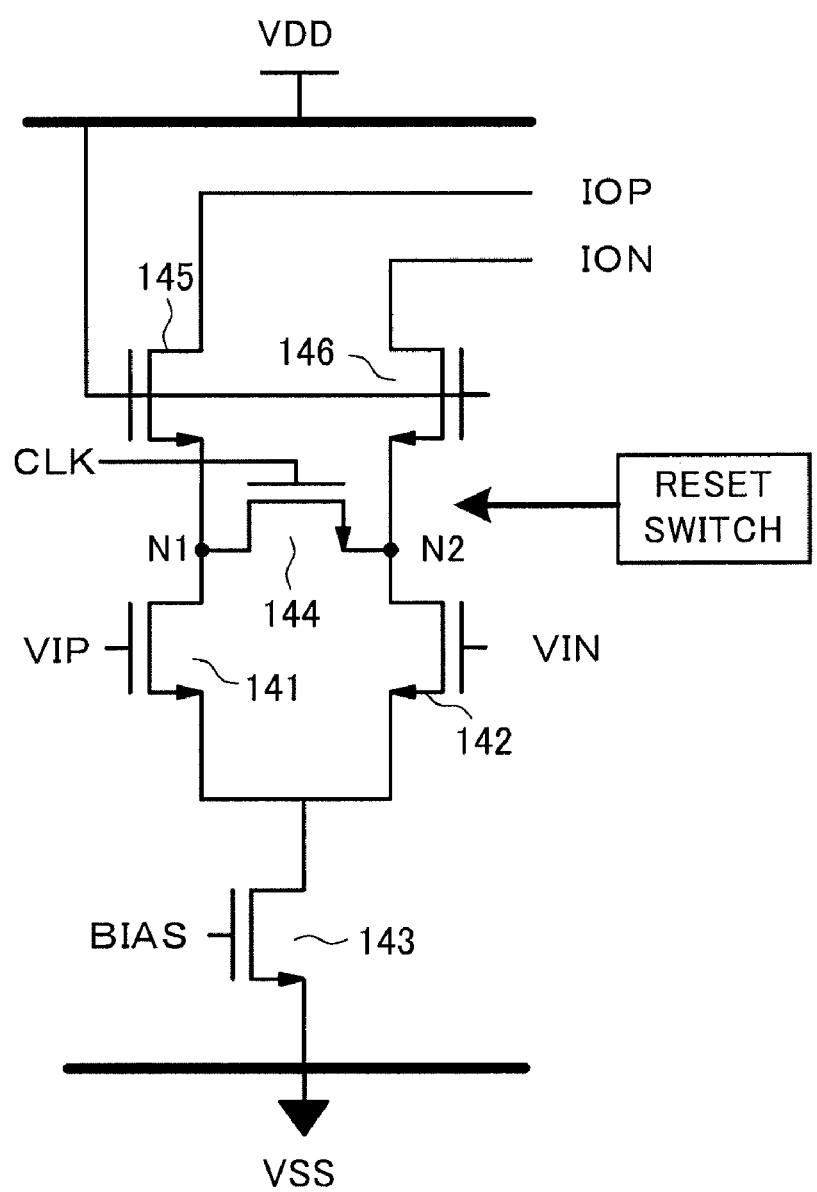
FIG. 9 A circuit diagram showing an example of the configuration of a differential distributed amplifier circuit.

FIG. 9 is a circuit diagram showing an example of the configuration of the differential distributed amplifier circuits 1401 to 1412.

The differential distributed amplifier circuit of FIG. 9 is configured by NMOS transistors NT141 to 146.

Sources of the NMOS transistors NT141 and NT142 configuring a differential pair are connected to each other, a connection point thereof is connected to a drain of the NMOS transistor NT143, and the source of the NMOS transistor NT143 is connected to a reference potential VSS.

Further, a gate of the NMOS transistor 141 is connected to a supply line of a signal (voltage) VIP, a gate of the NMOS transistor NT142 is connected to a supply line of a signal (voltage) VOP, and a gate of the NMOS transistor NT143 is connected to a supply line of a bias signal BIAS. This NMOS transistor NT143 functions as a current source.

A drain of the NMOS transistor NT144 is connected to a drain of the NMOS transistor NT141, and a node N1 is formed by the connection point thereof. A source of the NMOS transistor NT144 is connected to a drain of the NMOS transistor NT142, and a node N2 is formed by a connection point thereof.

A gate of the NMOS transistor NT144 is connected to a supply line of a clock signal CLK which is set at high level at the time of tracking and at low level at the time of holding.

This NMOS transistor 144 functions as a reset switch.

A source of the NMOS transistor NT145 is connected to a node N1 (drains of the NMOS transistors NT141 and NT144), and a drain is connected to a predetermined load resistor element of the load resistor group 150.

A source of the NMOS transistor NT146 is connected to a node N2 (drain of the NMOS transistor NT142 and source of NT144), and a drain is connected to a predetermined other load resistor element of the load resistor group 150.

Gates of the NMOS transistors NT145 and NT146 are connected to a power supply potential VDD.

The load resistor group 150 has load resistor elements R151 to R158 having first ends connected to the power supply potential VDD and output lines L1 to L8 first ends of which are connected to the other ends of the load resistor elements R151 to R158 and the other end sides of which are connected to either of two outputs of the differential distributed amplifier circuits 1401 to 1402 of the distributed amplifier circuit group 140.

To the output line L1, the followings are connected, a first output of the 1st differential distributed amplifier circuit 1401, a second output of the 5th differential distributed amplifier circuit 1405, and a first output of the 9th differential distributed amplifier circuit 1409. To the output line L2, the followings are connected, a second output of the 1st differential distributed amplifier circuit 1401, a first output of the 5th differential distributed amplifier circuit 1405, and a second output of the 9th differential distributed amplifier circuit 1409.

To the output line L3, the followings are connected, a first output of the 2nd differential distributed amplifier circuit 1402, a second output of the 6th differential distributed amplifier circuit 1406, and a first output of the 10th differential distributed amplifier circuit 1410. To the output line L4, the followings are connected, a second output of the 2nd differential distributed amplifier circuit 1402, a first output of the 6th differential distributed amplifier circuit 1406, and a second output of the 10th differential distributed amplifier circuit 1410.

To the output line L5, the followings are connected, a first output of the 3rd differential distributed amplifier circuit 1403, a second output of the 7th differential distributed amplifier circuit 1407, and a first output of the 11th differential distributed amplifier circuit 1411. To the output line L6, the followings are connected, a second output of the 3rd differential distributed amplifier circuit 1403, a first output of the 7th differential distributed amplifier circuit 1407, and a second output of the 11th differential distributed amplifier circuit 1411.

To the output line L7, the followings are connected, a first output of the 4th differential distributed amplifier circuit 1404, a second output of the 8th differential distributed amplifier circuit 1408, and a first output of the 12th differential distributed amplifier circuit 1412. To the output line L8, the followings are connected, a second output of the 4th differential distributed amplifier circuit 1404, a first output of the 8th differential distributed amplifier circuit 1408, and a second output of the 12th differential distributed amplifier circuit 1412.

The buffer group 160 has a plurality of, for example, four buffers 161 (I1) to 164 (I4).

An input terminal (−) side of the buffer 161 is connected to an output line L1 of the load resistor group 150, and an input terminal (+) side is connected to an output line L2 of the load resistor group 150.

An input terminal (−) side of the buffer 162 is connected to an output line L3 of the load resistor group 150, and an input terminal (+) side is connected to an output line L4 of the load resistor group 150.

An input terminal (−) side of the buffer 163 is connected to an output line L5 of the load resistor group 150, and an input terminal (+) side is connected to an output line L6 of the load resistor group 150.

An input terminal (−) side of the buffer 164 is connected to an output line L7 of the load resistor group 150, and an input terminal (+) side is connected to an output line L8 of the load resistor group 150.

An interpolation circuit 170 is configured by resistor elements R1701 to R1716 connected in series between the first output and the second output of the buffer 161 and resistor elements R1717 to R1732 connected in series between the second output and the first output of the buffer 161.

A first output of the buffer 162 is connected to a connection point of the resistor elements R1728 and R1729, and a second output of the buffer 162 is connected to a connection point of the resistor elements R1712 and R1713.

A first output of the buffer 163 is connected to a connection point of the resistor elements R1724 and R1725, and a second output of the buffer 163 is connected to the connection point of the resistor elements R1708 and R1709.

A first output of the buffer 164 is connected to a connection point of the resistor elements R1720 and R1721, and a second output of the buffer 164 is connected to a connection point of the resistor elements R1704 and R1705.

Figure 10:
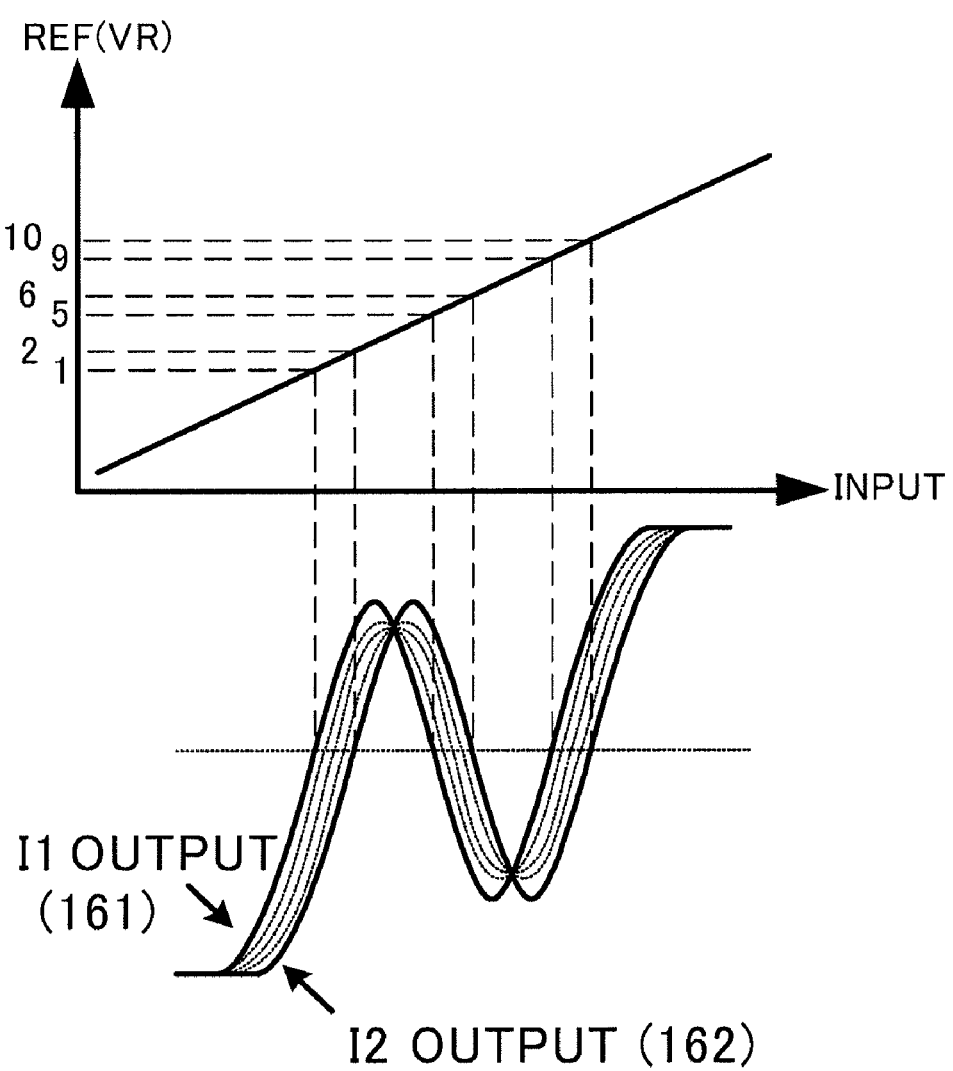
FIG. 10 A diagram showing interpolated waves of an interpolation circuit in the first embodiment.

In this way, the interpolation circuit 170 outputs sixteen (16) interpolated waves as shown in FIG. 10 by resister division.

The higher side master comparator latch group 180 compares differential outputs of the distributed amplifier circuit group 140 and outputs a binary signal of a predetermined number of bits.

The lower side master comparator 190 has 16 master comparators 1901 to 1916, compares outputs of the interpolation circuit 170, and outputs a binary signal.

Next, the operation by the above configuration will be described.

In the parallel type folding AD converters 100 of FIG. 6 and FIG. 7, the track/hold circuit 110 tracks the differential input signals Vin when the clock signal CLK is at the high level, holds and outputs the signals when the clock signal is at the low level, and inputs the output to the pre-amplification circuit group 130.

The pre-amplification circuits 1301 to 1312 of the pre-amplification circuit group 130 make a comparison of the input with the differential reference potentials divided by the resisters at the reference voltage generating circuit 120, and amplify and output the result.

By receiving the differential output signals from the pre-amplification circuits 1301 to 1312, the differential distributed amplifier circuits 1401 to 1412 generate folded waves (FIG. 8).

Here, as explained before, ΔVin1 in FIG. 8 is the input dynamic range of the differential distributed amplifier circuit. By superimposing these linear ranges on each other in the differential distributed amplifier circuits 1401 (1st), 1405 (5th), and 1409 (9th), the first folded wave WV1 having a degree 3 is generated. In the same way, by superimposing them on each other in the 2nd-6th-10th, 3rd-7th-11th, and 4th-8th-12th differential distributed amplifier circuits, four folded waves in total are generated.

Next, the buffers 161 (I1), 162 (I2), 163 (I3), and 164 (I4) receive the folded waves and output the same, and sixteen

(16) interpolated waves are output by the resistance-division interpolation circuit 170 (FIG. 10).

Here, FIG. 10 shows interpolated waves generated from outputs of the buffers 161 and 162 (I1,I2). In the same way, buffers 162 and 163 (I2 and I3), buffers 163 and 164 (I3 and I4), and buffers 164 and 161 (I4 and I1) generate interpolated waves. These signals are received by the latch comparator (MCL) to output a digital signal having four bits therefrom.

Here, the differential distributed amplifier circuit will be explained with reference to FIG. 9.

This circuit receives differential outputs VIP and VIN from the pre-amplification circuit of the front stage, and outputs differential current outputs IOP and ION. Here, a reset switch 144 is provided at the nodes N1 and N2 on the source side of the cascode transistors NT145 and 145.

Due to this, the output differential amplitude can be suppressed without adding the parasite capacitance of a switch to the differential current output IOP and ION side.

Figure 11:
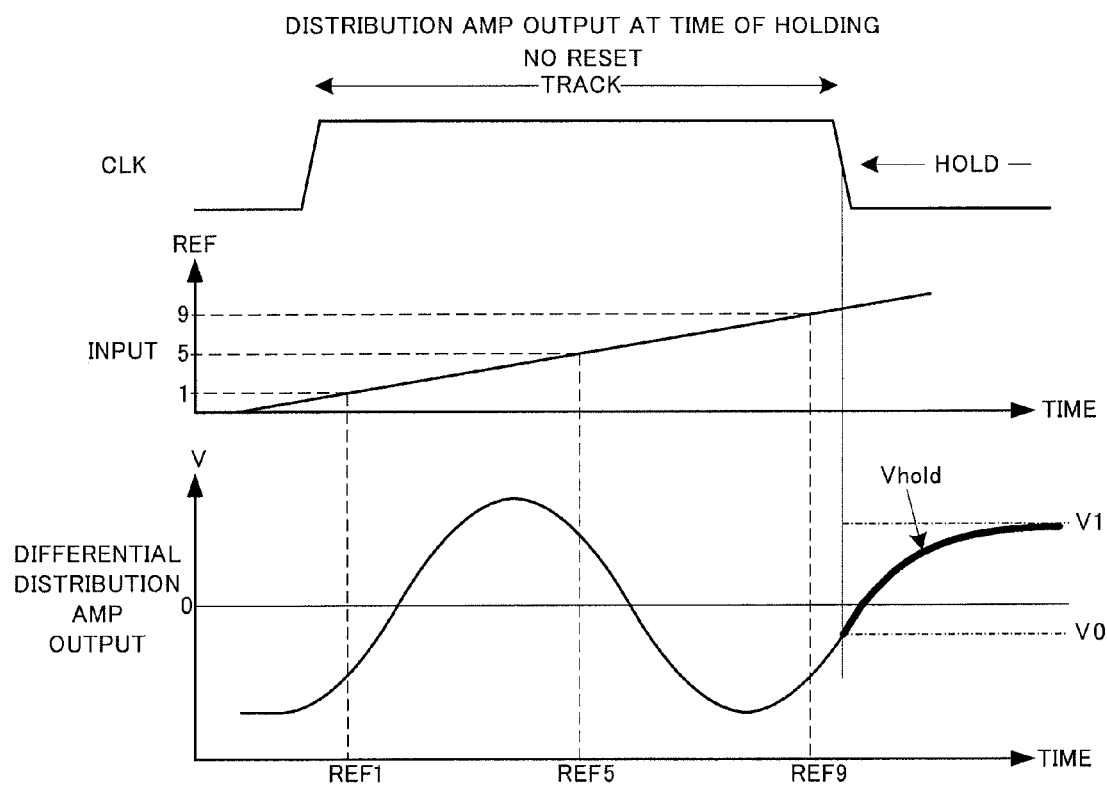
FIG. 11 A diagram showing a differential distributed amplifier circuit output in a case where there is no reset switch.
Figure 12:
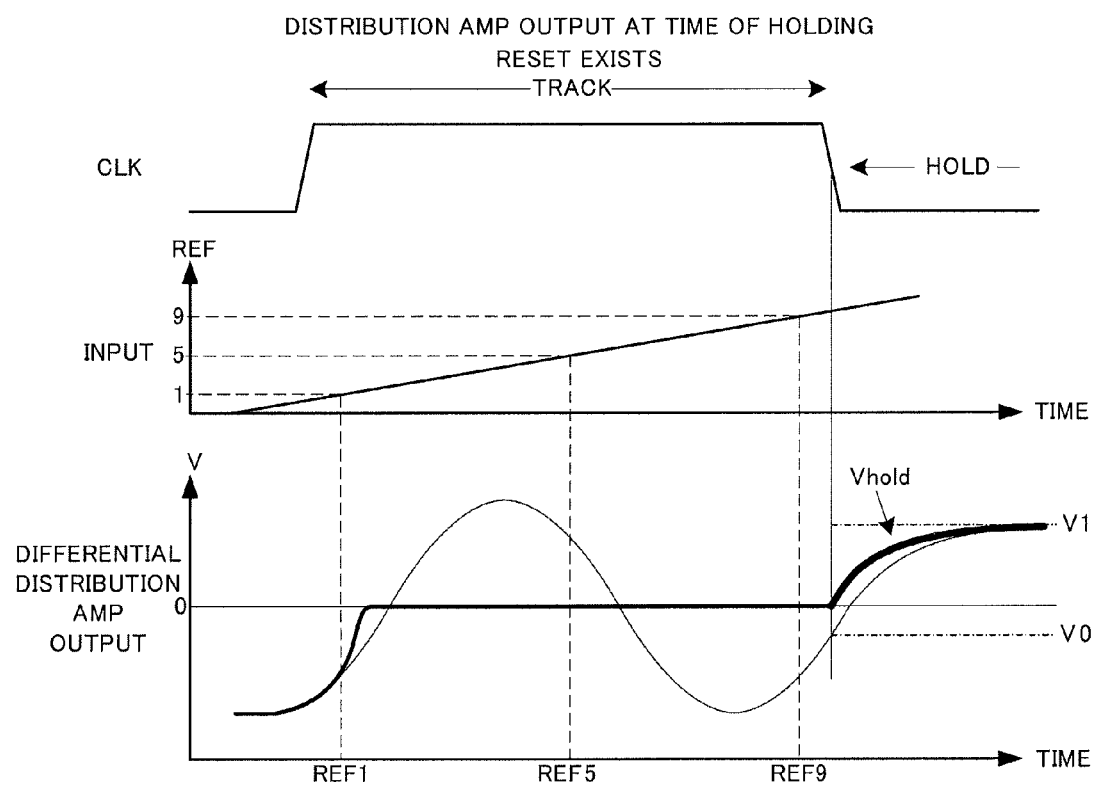
FIG. 12 A diagram showing a differential distributed amplifier circuit output in a case where there is a reset switch.

FIG. 11 and FIG. 12 are diagrams showing differential distributed amplifier circuit output waveforms when the input changes to REF1 to REF9 (VR1 to VR9) in both cases where there is and there is no switch.

The reset switch 144 is in synchronized with the clock of the track/hold circuit, is turned on at the time of a high level h, that is, the time of tracking, and is turned off at the time of a low level, that is, the time of holding. Here, the differential output at the time of holding is represented as follows.

[Equation 4]

$$Vhold = (V1-V0)\exp(-t/\tau) \qquad (*1)$$

Here, Vhold is the output of the differential distributed amplifier circuit at the time of holding, V1 is a desired output voltage value obtained by multiplying the input by a DC gain, V0 is an initial output voltage value at an instant when the clock switches from tracking to holding, and τ is the time constant of the amplification circuit output.

In the case of no switch, as shown in FIG. 11, there is an amplitude at the time of tracking as in the differential distributed amplifier circuit output waveform, therefore, the value settles from the initial voltage value V0 to V1.

Where there is a switch, as shown in FIG. 12, the switch is turned on at the time of tracking as in the differential distributed amplifier circuit output waveform, and the amplitude becomes 0. Accordingly, the initial voltage value V0=0 at the time of holding is obtained, and the settling becomes faster by the amount of V0.

Due to this, the response of the amplification circuit is improved, and the resultant high speed AD conversion is enabled.

Second Embodiment

Figure 13:
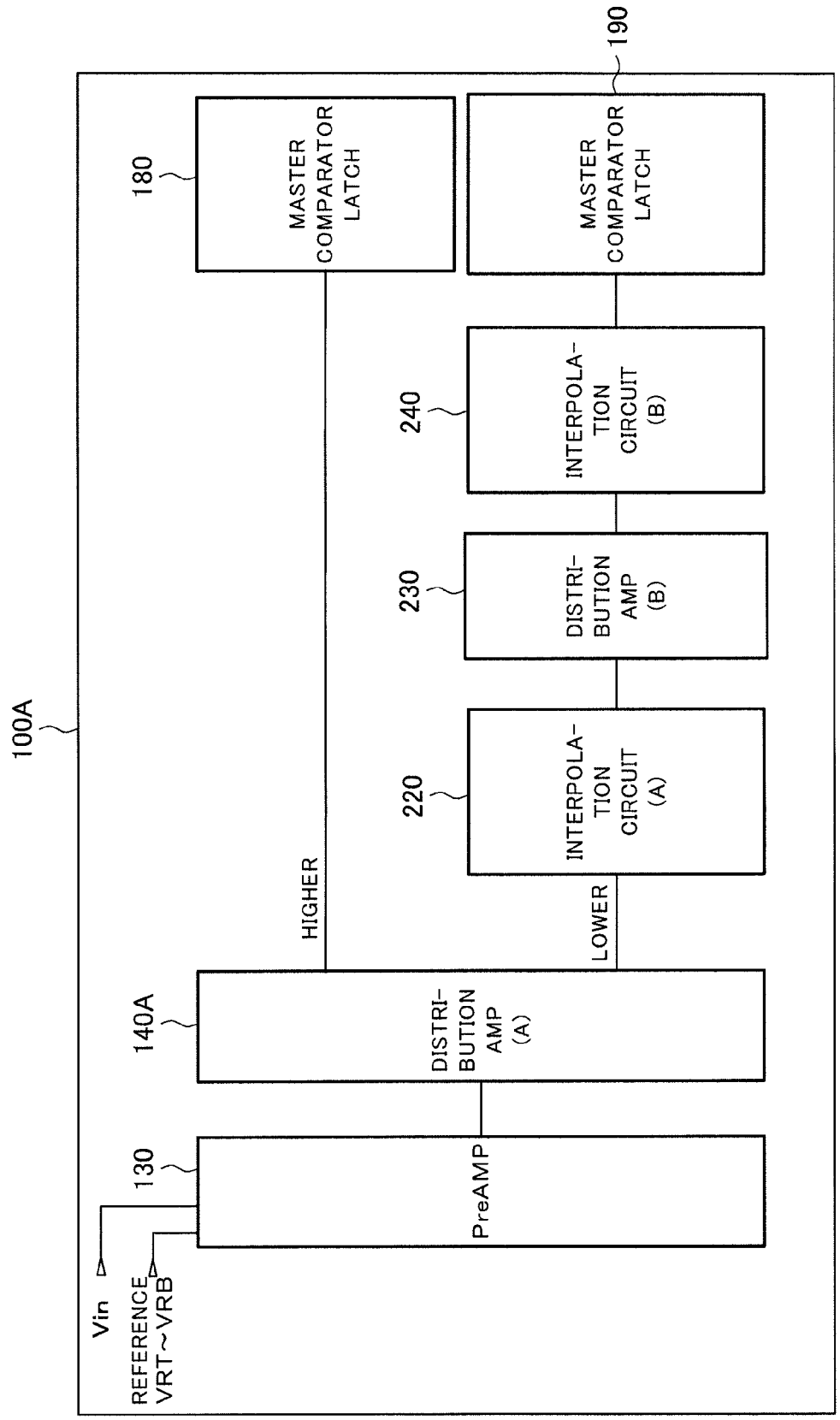
FIG. 13 A block diagram showing an example of the configuration of a cascade type folding AD converter according to a second embodiment of the present invention.

FIG. 13 is a block diagram showing an example of the configuration of a cascade type folding AD converter according to a second embodiment of the present invention.

Figure 14:
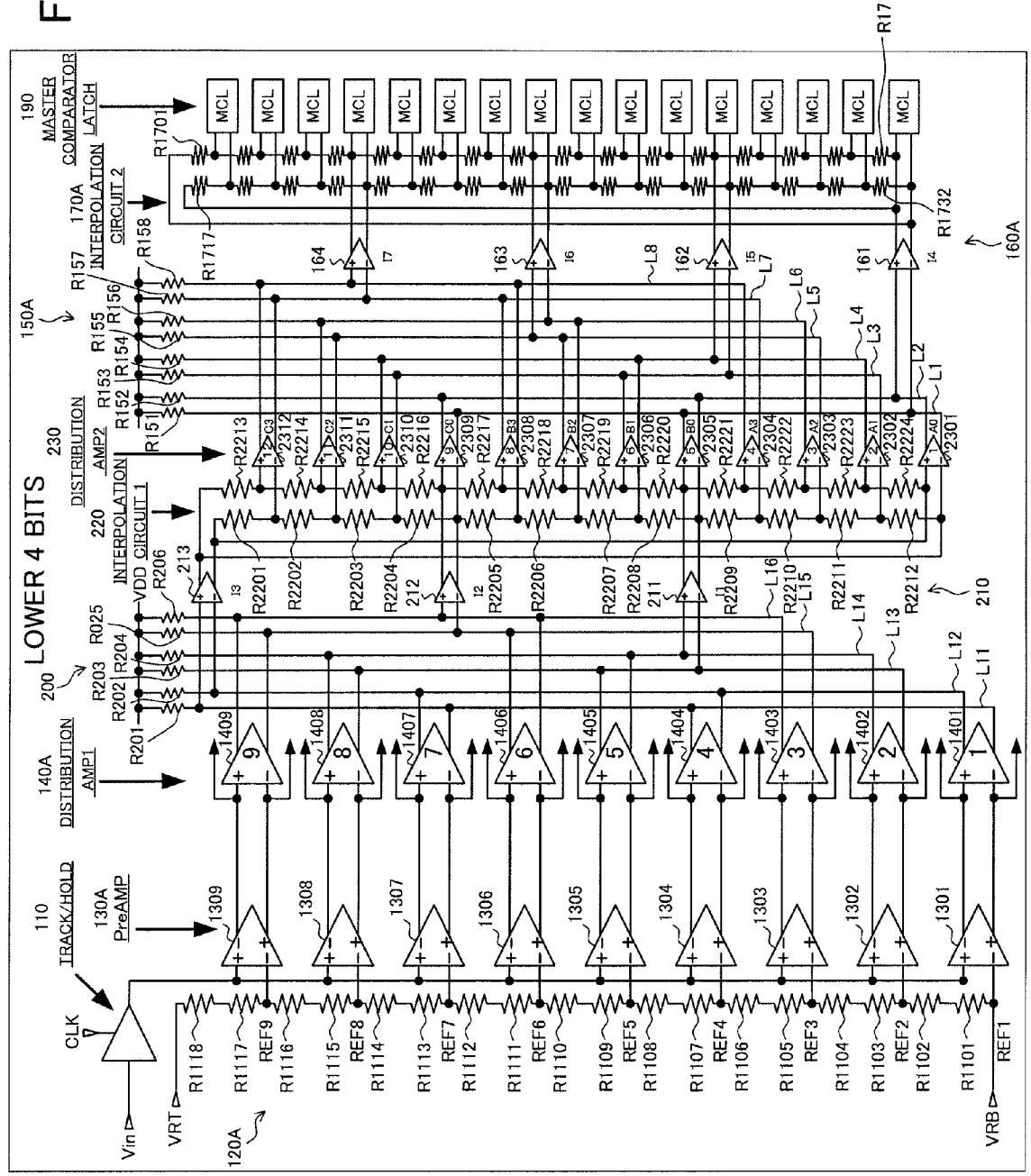
FIG. 14 A circuit diagram showing an example of the configuration of the lower bits of the cascade type folding AD converter of FIG. 13.

FIG. 14 is a circuit diagram showing an example of the configuration of the lower bits of the cascade type folding AD converter of FIG. 13.

The differences of an AD converter 100A of the second embodiment from the AD converter 100 of the first embodiment are that there are nine reference voltages VR1 to VR9 generated at a reference voltage generating circuit 120A and that as differential distributed amplifier circuits 1401 to 1409 of a first distributed amplifier circuit group 140A corresponding to this, a first load resistor group 200 is arranged at the output stage of the first distributed amplifier circuit group 140A, a first buffer group 210 is arranged at the output stage thereof, a first interpolation circuit 220 is arranged at the output stage of the first buffer group 210, a second distributed amplifier circuit group 230 is arranged at the output stage of the first interpolation circuit 220, a second load resistor element group 150A is arranged at the output stage of the second distributed amplifier circuit group 230, and a second buffer group 160A and further a second interpolation circuit 170A are arranged at the output stage of the second load resistor group 150A.

Among these circuits, the second load resistor group 150A has the same configuration as that of the load resistor group 150 of the first embodiment, the second buffer group 160A has the same configuration as that of the buffer group 160 of the first embodiment, and the second interpolation circuit 170A has the same configuration as that of the interpolation circuit 170 of the first embodiment.

The first load resistor group 200 has load resistor elements R201 to 8206 having first ends connected to the power supply potential VDD and output lines L11 to L16 first ends of which are connected to the other ends of the load resistor elements R201 to R208 and the other end sides of which are connected to either of the two outputs of the differential distributed amplifier circuits 1401 to 1409 of the distributed amplifier circuit group 140A.

To the output line L11, the followings are connected, a first output of the 1st differential distributed amplifier circuit 1401, a second output of the 5th differential distributed amplifier circuit 1405, and a first output of the 9th differential distributed amplifier circuit 1409. To the output line L12, the followings are connected, a second output of the 1st differential distributed amplifier circuit 1401, a first output of the 5th differential distributed amplifier circuit 1405, and a second output of the 9th differential distributed amplifier circuit 1409.

To the output line L13, the followings are connected, a first output of the 2nd differential distributed amplifier circuit 1402, a second output of the 6th differential distributed amplifier circuit 1406, and a first output of the 10th differential distributed amplifier circuit 1410. To the output line L14, the followings are connected, a second output of the 2nd differential distributed amplifier circuit 1402, a first output of the 6th differential distributed amplifier circuit 1406, and a second output of the 10th differential distributed amplifier circuit 1410.

To the output line L15, the followings are connected, a first output of the 3rd differential distributed amplifier circuit 1403, a second output of the 7th differential distributed amplifier circuit 1407, and a first output of the 11th differential distributed amplifier circuit 1411. To the output line L16, the followings are connected, a second output of the 3rd differential distributed amplifier circuit 1403, a first output of the 7th differential distributed amplifier circuit 1407, and a second output of the 11th differential distributed amplifier circuit 1411.

The first buffer group 210 has a plurality of, for example, three buffers 211 to 213.

An input terminal (−) side of the buffer 201 is connected to an output line L13 of the first load resistor group 200, and an input terminal (+) side is connected to an output line L14 of the load resistor group 150.

An input terminal (−) side of the buffer 212 is connected to an output line L15 of the first load resistor group 200, and an input terminal (+) side is connected to an output line L15 of the first load resistor group 200.

An input terminal (−) side of the buffer 213 is connected to an output line L11 of the first load resistor group 200, and an input terminal (+) side is connected to an output line L12 of the first load resistor group 200.

The first interpolation circuit 220 is configured by resistor elements R2201 to R2212 connected in series between the first output and the second output of the buffer 213 and resistor elements R2213 to R2224 connected in series between the second output and the first output of the buffer 213.

Further, a first output of the buffer 212 is connected to a connection point of the resistor elements R2204 and 82205, and a second output of the buffer 212 is connected to a connection point of the resistor elements R2216 and R2217.

A first output of the buffer 211 is connected to a connection point of the resistor elements R2208 and R2209, and a second output of the buffer 211 is connected to a connection point of the resistor elements R2220 and R2221.

The second distributed amplifier circuit group 230 has 12 differential distributed amplifier circuits 2301 to 2312.

An input terminal (−) side of the differential distributed amplifier circuit 2301 is connected to a second output of the buffer 213, and an input terminal (+) side is connected to a first output of the buffer 213.

An input terminal (−) side of the differential distributed amplifier circuit 2302 is connected to a connection point of the resistor elements R2211 and R2212, and an input terminal (+) side is connected to a connection point of the resistor elements R2223 and R2224.

An input terminal (−) side of the differential distributed amplifier circuit 2303 is connected to a connection point of the resistor elements R2210 and R2211, and an input terminal (+) side is connected to a connection point of the resistor elements R2222 and R2223.

An input terminal (−) side of the differential distributed amplifier circuit 2304 is connected to a connection point of the resistor elements R2209 and R2210, and an input terminal (+) side is connected to a connection point of the resistor elements R2221 and R2222.

An input terminal (−) side of the differential distributed amplifier circuit 2305 is connected to a connection point of the resistor elements R2208 and R2209, and an input terminal (+) side is connected to a connection point of the resistor elements R2220 and R2221.

An input terminal (−) side of the differential distributed amplifier circuit 2306 is connected to a connection point of the resistor elements R2207 and R2208, and an input terminal (+) side is connected to a connection point of the resistor elements R2219 and R2220.

An input terminal (−) side of the differential distributed amplifier circuit 2307 is connected to a connection point of the resistor elements R2206 and R2207, and an input terminal (+) side is connected to a connection point of the resistor elements R2218 and R2219.

An input terminal (−) side of the differential distributed amplifier circuit 2308 is connected to a connection point of the resistor elements R2205 and R2206, and an input terminal (+) side is connected to a connection point of the resistor elements R2217 and R2218.

An input terminal (−) side of the differential distributed amplifier circuit 2309 is connected to a connection point of the resistor elements R2204 and R2205, and an input terminal (+) side is connected to a connection point of the resistor elements R2216 and R2217.

An input terminal (−) side of the differential distributed amplifier circuit 2310 is connected to a connection point of the resistor elements R2203 and R2204, and an input terminal (+) side is connected to a connection point of the resistor elements R2215 and R2216.

An input terminal (−) side of the differential distributed amplifier circuit 2311 is connected to a connection point of the resistor elements R2202 and 82203, and an input terminal (+) side is connected to a connection point of the resistor elements R2214 and R2215.

An input terminal (−) side of the differential distributed amplifier circuit 2312 is connected to a connection point of the resistor elements R2201 and R2202, and an input terminal (+) side is connected to a connection point of the resistor elements R2213 and R2214.

Note that outputs of the differential distributed amplifier circuits 2301 to 2312 of the second distributed amplifier circuit group 230 are connected to the output lines L1 to L8 of the load resistor group 150, with the same relationships of the differential distributed amplifier circuits 1401 to 1412 of the first embodiment (FIG. 7). Accordingly, a detailed explanation thereof is omitted here.

In the second embodiment, basically, the processing up to the first interpolation circuit 220 is carried out in the same way as the first embodiment.

Figure 15:
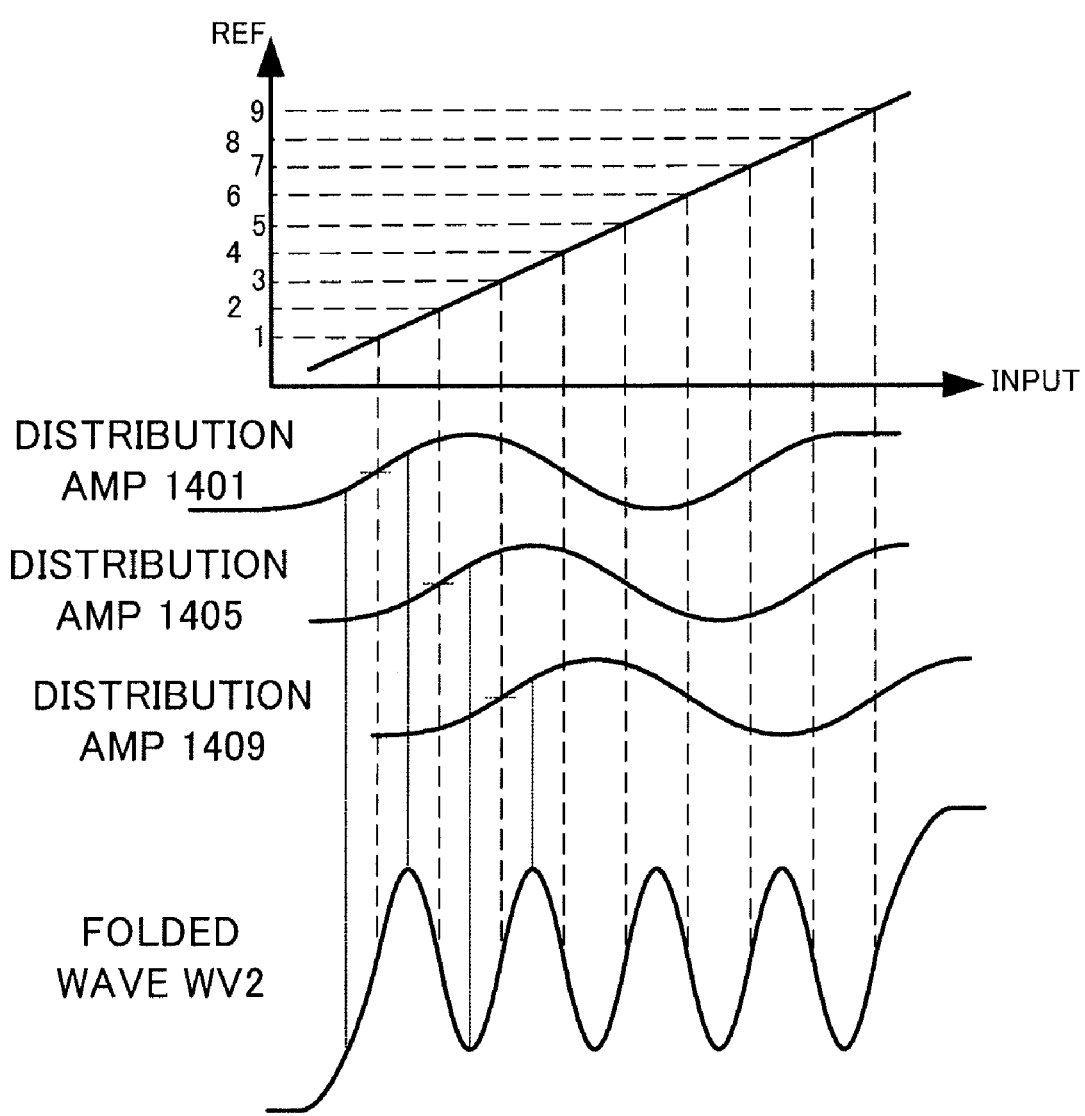
FIG. 15 A diagram showing a folded wave of the distributed amplifier circuit output in the second embodiment.
Figure 16:
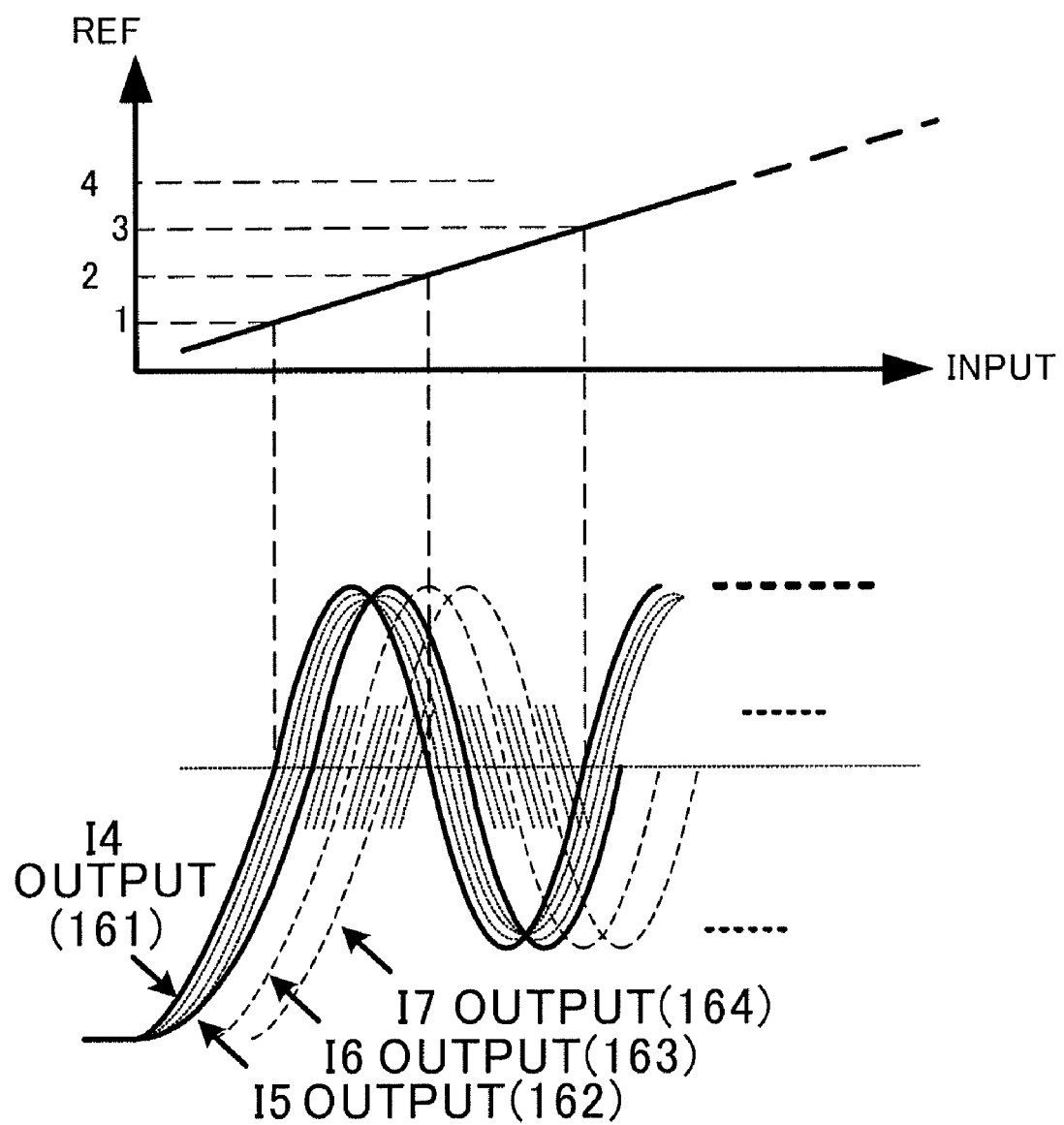
FIG. 16 A diagram showing interpolated waves of an interpolation circuit in the second embodiment.

Then, as shown in FIG. 15, the differential distributed amplifier circuits 2301 to 2312 of the second distributed amplifier circuit group 230 receive the amplification circuit outputs which are folded to the degree from the first interpolation circuit 220. By superimposing the outputs on each other in the first, fifth, and ninth circuits, a folded wave WV2 having a degree 9 is generated.

Next, the buffers 161 to 164 receive the above folded waves, the four-divided second interpolation circuit 170A used by the resistors outputs 16 interpolated waves (FIG. 15), then the latch comparator MCL receives these and outputs a digital signal having four bits.

Here, when the gains of the differential distributed amplifier circuits 2301 to 2312 of the second distributed amplifier circuit group 230 of the cascade type folding AD converter 100A are A2, the output signal is VO2, the gains of the differential distributed amplifier circuits 1401 to 1409 of the first distributed amplifier circuit group 140A are A1, the output signal is VO1, the gains of the pre-amplification circuits 1301 to 1309 of the pre-amplification circuit group 130A are AP, the output signal is VOP, and the input signal is Vin, the following relationships are obtained.

[Equations 5]

$$VOP = AP * V\text{in} \qquad (*1)$$

$$VO1 = A1 * VOP \qquad (*2)$$

$$VO2 = A2 * VO1 \qquad (*3)$$

Here, by providing the reset switch in the pre-amplification circuit of the first stage, VOP becomes equal to 0 at the time of tracking and the amplification circuit output signals VO1 and VO2 become 0 as well.

Accordingly, by providing the reset switch in only the pre-amplification circuit of the first stage, the output amplitude of each distributed amplifier circuit is suppressed, and the analog settling can be quickened.

Figure 17:
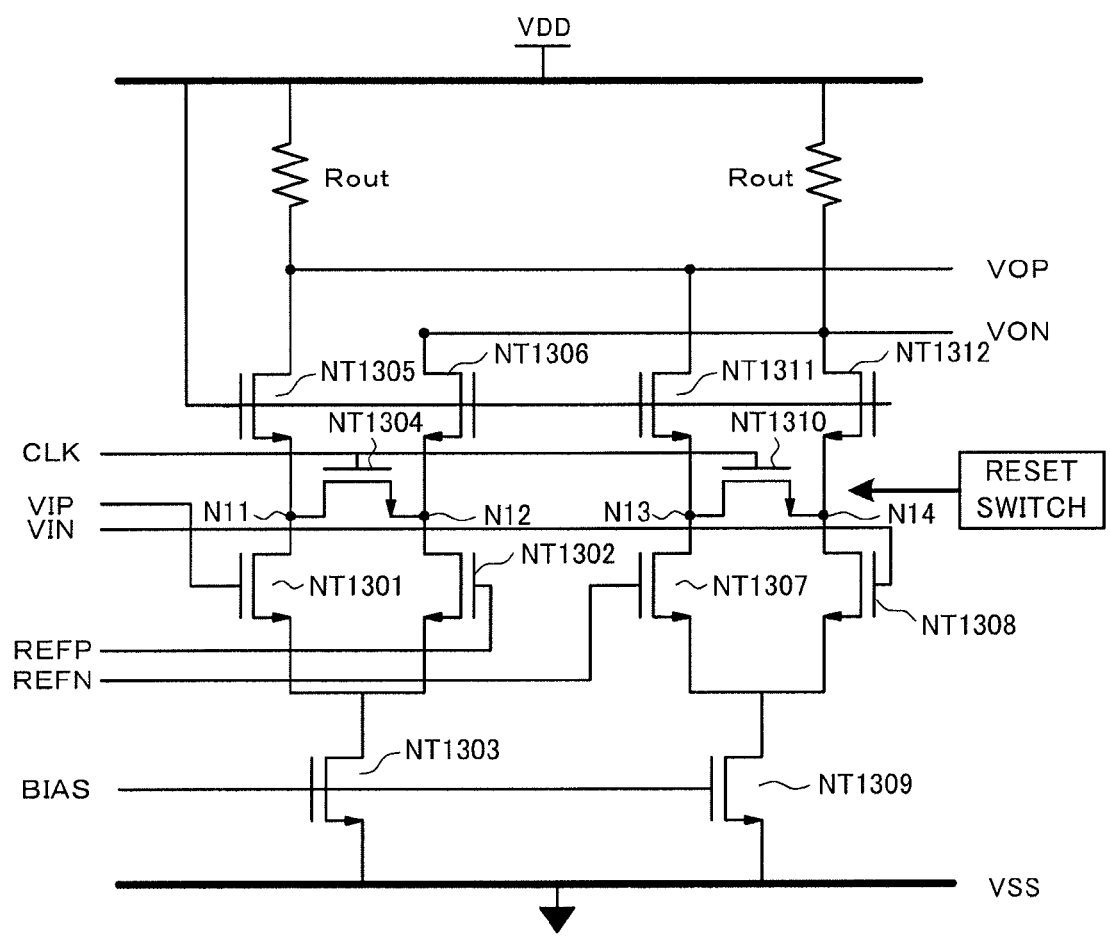
FIG. 17 A diagram showing an example of the circuit of a pre-amplification circuit of a first stage in the second embodiment.

FIG. 17 is a diagram showing an example of the circuit of the pre-amplification circuit of the first stage in the second embodiment.

The differential amplifier circuit of FIG. 17 is configured by NMOS transistors NT1301 to NT1312 and load resistor elements Rout1 and Rout2.

Sources of the NMOS transistors NT1301 and NT1302 configuring a differential pair are connected to each other, a connection point thereof is connected to a drain of the NMOS transistor NT1303, and a source of the NMOS transistor NT1303 is connected to the reference potential VSS.

Then, a gate of the NMOS transistor 1301 is connected to a supply line of the signal (voltage) VIP, a gate of the NMOS transistor NT1302 is connected to a supply line of the signal (voltage) REFP, and a gate of the NMOS transistor NT1303 is connected to a supply line of the bias signal BAIS. This NMOS transistor NT1303 functions as a current source.

A drain of the NMOS transistor NT1304 is connected to a drain of the NMOS transistor NT1301, and a node N11 is formed by a connection point thereof. A source of the NMOS transistor NT1304 is connected to a drain of the NMOS transistor NT1302, and a node N12 is formed by a connection point thereof.

A gate of the NMOS transistor NT1304 is connected to a supply line of the clock signal CLK set at high level at the time of tracking and at a low level at the time of holding.

This NMOS transistor 1304 functions as a reset switch.

A source of the NMOS transistor NT1305 is connected to a node N11 (drains of the NMOS transistors NT1301 and NT1304), and a drain is connected to a load resistor Rout1.

A source of the NMOS transistor NT1306 is connected to a node N12 (drain of the NMOS transistors NT1302, source of NT1304), and a drain is connected to a load resistor element Rout2.

Then, gates of the NMOS transistors NT1305 and NT1306 are connected to the power supply potential VDD.

Sources of the NMOS transistors NT1307 and NT1308 configuring a differential pair are connected to each other, a connection point thereof is connected to a drain of the NMOS transistor NT1309, and a source of the NMOS transistor NT13039 is connected to the reference potential.

Further, the gate of the NMOS transistor 1307 is connected to a supply line of the signal (voltage) PEFN, a gate of the NMOS transistor NT1308 is connected to a supply line of the signal (voltage) VIN, and a gate of the NMOS transistor NT1309 is connected to a supply line of the bias signal BAIS. This NMOS transistor NT1309 functions as a current source.

A drain of the NMOS transistor NT1310 is connected to a drain of the NMOS transistor NT1307, and a node N13 is formed by a connection point thereof. A source of the NMOS transistor NT1310 is connected to a drain of the NMOS transistor NT1308, and a node N14 is formed by a connection point thereof.

A gate of the NMOS transistor NT1310 is connected to a supply line of the clock signal CLK set at a high level at the time of tracking and at low level at the time of holding.

This NMOS transistor 1310 functions as the reset switch.

A source of the NMOS transistor NT1311 is connected to the node N13 (drains of the NMOS transistors NT1307 and NT1310), and a drain is connected to the load resistor Rout1.

A source of the NMOS transistor NT1312 is connected to the node N14 (drain of the NMOS transistors NT1308, source of NT1310), and a drain is connected to the load resistor element Rout2.

Then, gates of the NMOS transistors NT1311 and NT1312 are connected to the power supply potential VDD.

The cascode transistors NT1305, NT1306, NT1311, and 1312 are provided in the differential pair VOP and VON of the output, and the reset switches NT1304 and NT1310 are provided on the source side thereof. In synchronization with the clock signal CLK of the track/hold circuit in the same way as the first embodiment, these are turned on when the clock signal CLK is at a high level, that is, at the time of tracking, and turned off at the time of the low level, that is, the time of holding.

Due to this, at the time of tracking, the signal amplitude of the subsequent stages is suppressed, the response of the amplification circuit is improved, and the resultant high speed AD conversion is achieved.

According to the present embodiment, the following effects can be obtained.

In the folding type AD converter, by providing a switch on the source side of the cascode transistors in the amplification circuit, the response of the amplification circuit can be improved without adding the parasite capacitance of the switch to the output node.

In a cascade type folding AD converter, by introducing a switch into only the pre-amplification circuit of the first stage, an AD converter enabling high speed operation is provided.

An example of a lower 4-bit converter was explained in the above embodiment, but the present invention is not limited to this configuration and can be applied to a 4-bit or more bits converter.

The invention claimed is:

1. A folding circuit comprising:
a reference voltage generating circuit that generates a plurality of different voltages as reference voltages; and
a plurality of amplification circuits that convert differential voltages, between the plurality of reference voltages and an analog input voltage, to differential currents for output,
output ends of the amplification circuits being alternately connected,
each of the amplification circuits being configured by a differential amplifier circuit having a pair of cascode output NMOS transistors and a air of cascode input NMOS transistors, and
a switch being provided, which is turned on in synchronization with a control clock, (a) between sources of the pair of cascode output transistors and (b) between drains of the pair of cascode input transistor, wherein gates of the pair of cascode input transistors receive the differential voltages; and the sources of the pair of cascode input transistors are connected to ground via a bias circuit.

2. A folding circuit as set forth in claim 1, wherein
a pre-amplification circuit which is configured by a differential pair input stage, cascode output transistors, and a load resistor is provided at a front stage of each amplification circuit, and
a switch which is turned on in synchronization with the control clock is provided between sources of the cascode output transistors of the pre-amplification circuit.

3. An analog-to-digital converter having a folding circuit generating folded waves of a predetermined number of folds, the folding circuit comprising:
a reference voltage generating circuit that generates a plurality of different voltages as reference voltages; and
a plurality of amplification circuits that convert differential voltages, between the plurality of reference voltages and an analog input voltage, to differential currents for output,
output ends of the amplification circuits being alternately connected,
each of the amplification circuits being configured by a differential amplifier circuit having a pair of cascode output NMOS transistors and a pair of cascode input NMOS transistors, and
a switch, which is turned on in synchronization with a control clock, being provided (a) between sources of the pair of cascode NMOS output transistors and (b) between drains of the pair of cascode input NMOS transistors, wherein gates of the pair of cascode input NMOS transistors receive the differential voltage; and the sources of the pair of cascade input transistors are connected to ground via a bias circuit.

4. An analog-to-digital converter as set forth in claim 3, wherein:

a pre-amplification circuit which is configured by a differential pair input stage, cascode output transistors, and load resistors is provided at the front stage of the amplification circuit, and a switch, which is turned on in synchronization with the control clock, is provided between sources of the cascode output transistors of the pre-amplification circuit.

* * * * *